United States Patent [19]
Tsai et al.

[11] Patent Number: 6,010,952
[45] Date of Patent: Jan. 4, 2000

[54] PROCESS FOR FORMING METAL SILICIDE CONTACTS USING AMORPHIZATION OF EXPOSED SILICON WHILE MINIMIZING DEVICE DEGRADATION

[75] Inventors: Jiunn-Yann Tsai, San Jose; Zhihai Wang, Sunnyvale; Wen-Chin Yeh, Fremont, all of Calif.

[73] Assignee: LSI Logic Corporation, Milpitas, Calif.

[21] Appl. No.: 08/787,992

[22] Filed: Jan. 23, 1997

[51] Int. Cl.$^7$ ...................................................... H01L 29/10
[52] U.S. Cl. .......................... 438/528; 438/510; 438/514
[58] Field of Search .................................... 438/528, 510, 438/514, 523, 525, 532, 533, DIG. 82, DIG. 83, DIG. 84

[56] References Cited

U.S. PATENT DOCUMENTS

| | | |
|---|---|---|
| 3,615,875 | 10/1971 | Morita . |
| 4,683,645 | 8/1987 | Naguib et al. . |
| 4,816,893 | 3/1989 | Mayer et al. . |
| 5,218,221 | 6/1993 | Okumura . |
| 5,789,802 | 8/1998 | Tripsas . |

OTHER PUBLICATIONS

Jorge A. Kittl, Qi–Zhong Hong, Mark Rodder, Douglas A. Prinslow and George R. Misium, "A Ti Salicide Process for 0.10 micron Gate Length CMOS Technology" Sympossium on VLSI Technology Digest of Technical Paper, 1996.

Horiuchi, T. , et al. , "A New Titanium Salicide Process (DIET) for Subquarter Micron CMOS", 1994 Symposium on VLSI Technology Digest of Technical Papers, pp. 121–122.

*Primary Examiner*—Charles Bowers
*Assistant Examiner*—Martin Sulsky
*Attorney, Agent, or Firm*—John P. Taylor

[57] ABSTRACT

An improved process is provided for amorphizing portions of a silicon substrate and a polysilicon gate electrode surface to be converted to metal silicide by subsequent reaction of the amorphized silicon with a metal layer applied over the silicon substrate and polysilicon gate electrode after the amorphizing step. The improvement comprises implanting the exposed surface of the silicon substrate and the surface of the polysilicon gate electrode with a beam of amorphizing ions at an angle of at least 15° to a line perpendicular to the plane of the surface of the silicon substrate to thereby inhibit channeling of the implanted ions through the gate electrode to the underlying gate oxide and channel of the MOS structure. The implant angle of the beam of amorphizing ions is preferably at least 30°, but should not exceed 60°, with respect to a line perpendicular to the plane of the surface of the silicon substrate.

21 Claims, 2 Drawing Sheets

PROCESS FOR FORMING METAL SILICIDE CONTACTS USING AMORPHIZATION OF EXPOSED SILICON WHILE MINIMIZING DEVICE DEGRADATION

BACKGROUND OF THE INVENTION

1. Field of the Invention

This invention relates to the formation of contacts for integrated circuit structures. More particularly, this invention relates to an improved process for forming self-aligned metal silicide contacts for MOS structures at lower temperatures to conserve thermal budget while minimizing device degradation.

2. Description of the Related Art

In the formation of contacts to the source and drain regions and gate electrode of an MOS integrated circuit device, it has become an established practice to enhance the conductivity of the contacts by reacting the exposed doped silicon surfaces of the source and drain regions and the doped silicon gate electrode with a metal such as titanium capable of forming a metal silicide which will have a lower resistivity than the doped silicon itself. One conventional way of forming such metal silicide contacts is to blanket deposit over the integrated circuit structure (including the $SiO_2$ insulation material adjacent the exposed silicon regions) a layer of a metal, such as titanium, capable of reacting with the silicon to form the desired metal silicide contact material. Following the blanket deposit, the structure is annealed at an elevated temperature sufficiently high so that the metal will react with the exposed silicon to form the desired metal silicide. Usually this anneal is carried out in a nitrogen atmosphere to both inhibit the undesirable formation of metal oxide and to form metal nitride which is beneficial for adherence of a metal layer subsequently formed over the metal silicide layer.

It has been found, however, that the temperature must be carefully controlled during this anneal to avoid the simultaneous undesirable reaction of the silicide-forming metal layer with the silicon in the silicon oxide insulation material adjacent the exposed silicon. For example, when using titanium as the silicide-forming metal, the temperature of the anneal should be about 600–700° C. to avoid reaction between the titanium and the silicon in the silicon oxide insulation to avoid degradation of the insulation or the formation of undesired titanium silicide over the insulation. However, this results in the formation of a metal silicide over the exposed silicon having a phase (C49) which is less than satisfactory as a conductive contact material. To overcome this, the structure is etched to remove unreacted metal, e.g., titanium, and then the structure is subject to a second, higher temperature, anneal of about 800° C., which will convert the already formed metal silicide, e.g., titanium silicide, to a phase (C54) which is more desirable for use as an electrically conductive metal silicide contact, without risk of reacting titanium metal with the silicon oxide insulation at this higher annealing temperature, since the unreacted metal, e.g., titanium, has already been removed by the etch step prior to the exposure of the structure to the higher annealing temperature.

While the above two step annealing process has been satisfactory for larger line width structures, as the line widths shrank in size, the time and temperature required to convert the C49 phase titanium silicide to the more desirable C54 phase has increased, apparently due to a reduction in nucleation sites in the titanium silicide. This, in turn, is the result of the large grain sizes of the titanium silicide relative to the size of the line widths wherein the normal two dimensional density of grain boundaries (and therefore density of nucleation sites) has been reduced to one dimension as the line width dimension approaches the same size as the grain.

To overcome this problem, it has been proposed to decrease the grain size of the metal silicide which would, in turn, increase the grain boundaries and therefore increase the nucleation sites. Horiuchi et al., in an article entitled "A New Titanium Salicide Process (DIET) for Sub-quarter Micron CMOS", describe the use of pre-amorphization of the silicon prior to the silicide formation, which results in the subsequent formation of smaller grain $C49-TiSi_2$ during the siliciding step, thereby increasing the density of nucleation sites. This, then, means that smaller line width structures could have the same thermal budgets as larger line width structures, from the standpoint of C54 phase $TiSi_2$ formation.

This local amorphization of the silicon substrate adjacent the surface of the substrate, and the polysilicon gate electrode adjacent its surface, is carried out by the blanket implantation of the silicon surfaces, for example, with arsenic. Such conventionally amorphization is usually carried out using a tilt angle of from 0–10° between the axis of the implant beam and a line perpendicular to the plane of the surface of the substrate when a silicon substrate having a 100 crystallographic surface orientation is implanted. A 100 oriented surface silicon substrate is the preferred crystallographic orientation for the formation of MOS devices in/on a silicon substrate.

However, it has been discovered that the leakage of small line width NMOS structure increases when using such amorphization of the silicon. Apparently this is due to penetration (into the NMOS channel) of some of the implanted amorphizing ions which pass completely through the polysilicon gate electrode which is supposed to act as a mask for the underlying channel region of the substrate. Apparently this passage of the implanting ions through the gate electrode is made possible because as the line widths shrink, so does the thickness of the gate electrode, thereby resulting in a thinner polysilicon gate electrode which more easily penetrated by the implanting ions than previous thicker gate electrodes utilized with larger line-width technologies. This penetration of the implanting ions through the thin polysilicon gate electrode is believed to be exacerbated by the presence of some crystalline grains of silicon in the polysilicon which not only extend from the top surface of the electrode to the bottom surface (because of the thinness of the polysilicon electrode), but are also oriented crystallographically in such a way that the implanted ion can channel through the polysilicon crystal into the underlying MOS channel in the substrate. That is, the implanted ion sees the particular crystalline grain as a single crystal structure oriented to permit the implanted ion to channel through the crystal.

It would, therefore, be desirable to provide a smaller grain size metal silicide by amorphizing of the silicon, to thereby enhance the subsequent higher temperature anneal of the metal silicide while conserving the thermal budget, without, however, degrading the performance of the MOS devices in the integrated circuit structure.

SUMMARY OF THE INVENTION

In accordance with the invention, an improved process is provided for amorphizing exposed portions of a silicon substrate surface and the surface of a polysilicon gate electrode to be converted to metal silicide by subsequent reaction of the amorphized silicon with a metal layer applied over the silicon substrate and the polysilicon gate electrode after the amorphizing step. The improvement comprises implanting the exposed portions of the surface of the silicon substrate and the surface of the polysilicon gate electrode with a beam of amorphizing ions at an angle of at least 15° to a line perpendicular to the plane of the surface of the silicon substrate to thereby inhibit channeling of the implanted ions through the gate electrode to the underlying gate oxide and channel of the MOS structure. The implant angle of the beam of amorphizing ions is preferably at least 30°, but should not exceed 60°, with respect to a line perpendicular to the plane of the surface of the silicon substrate.

DETAILED DESCRIPTION OF THE INVENTION

The invention comprises an improved process for amorphizing exposed portions of a silicon substrate and the surface of a polysilicon gate electrode to be converted to metal silicide by subsequent reaction of the amorphized silicon with a metal layer applied over the silicon substrate and the gate electrode after the amorphizing step. The improvement comprises implanting the silicon substrate with a beam of amorphizing ions at an angle of at least 15° to a line perpendicular to the plane of the surface of the silicon substrate to thereby inhibit channeling of the implanted ions through the gate electrode to the underlying gate oxide and channel of the MOS structure.

Figure 1:
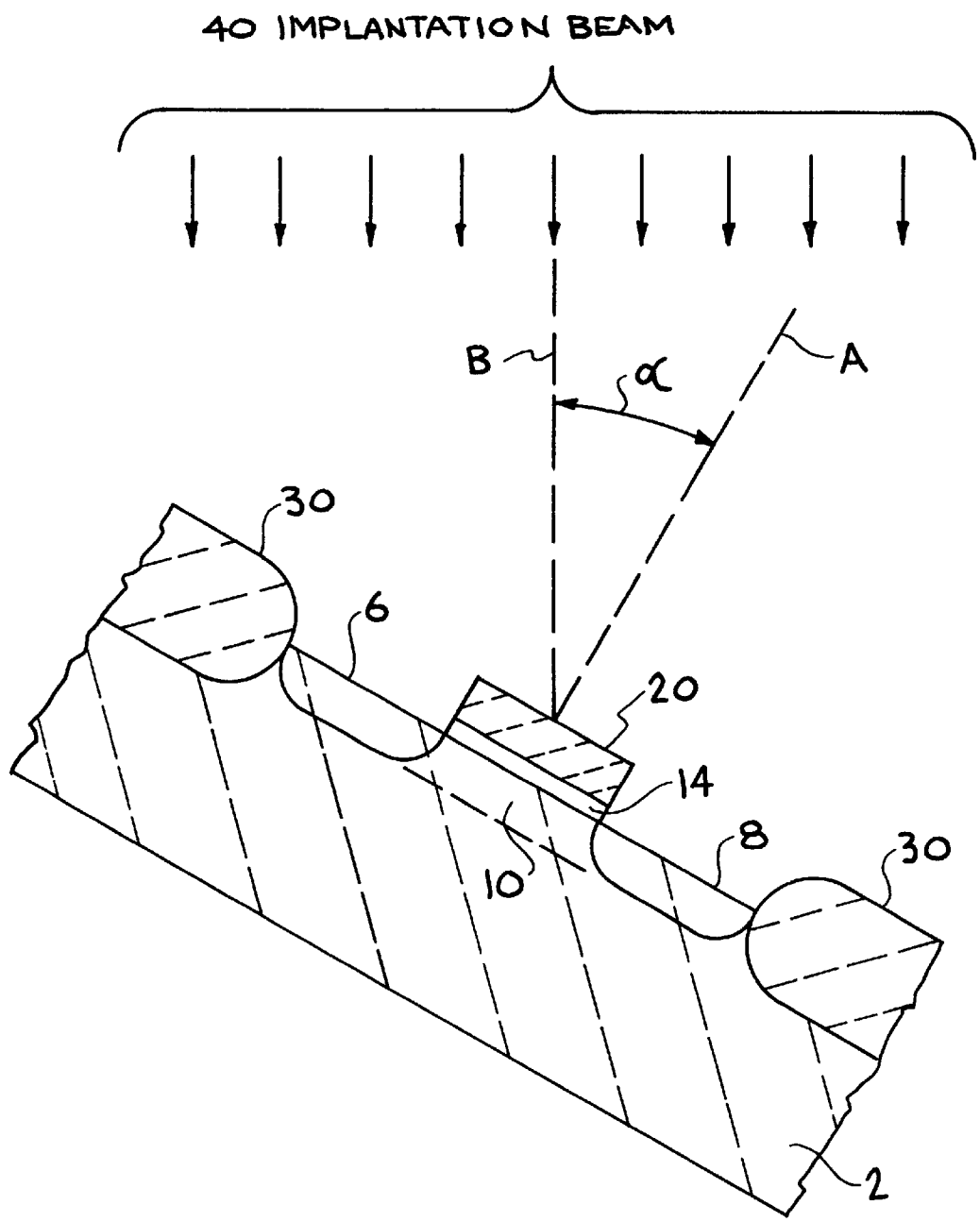
FIG. 1 is a fragmentary vertical cross-sectional of a silicon substrate having an MOS structure formed thereon being tilted and implanted with an amorphizing dose of ions in accordance with the invention.

Turning now to FIG. 1, a silicon substrate 2 is shown having a typical MOS device constructed thereon comprising a source region 6, a drain region 8, and a channel region 10 therebetween formed in substrate 2, with a gate oxide 14 formed over channel region 10 and a polysilicon gate electrode 20 formed over gate oxide 14. Field oxide portions 30, grown in the surface of substrate 2, electrically isolate the MOS device from other portions of the integrated circuit structure formed in and on substrate 2.

FIG. 1 also shows a dashed axis line A which is perpendicular to the plane of the surface of substrate 2. In accordance with the invention, substrate 2 and its perpendicular axis line A are shown tilted with respect to dashed axis line B of an implantation beam 40 which is used to implant an amorphizing dose of ions into the surface of silicon substrate 2. The degree of tilt of substrate 2, with respect to implant beam 40 is defined by an angle α between substrate axis line A and beam axis line B.

In accordance with the invention, implant angle α of amorphizing implant beam 40 is at least 15°, and is preferably at least 30°, but should not exceed 60°, with respect to a line perpendicular to the plane of the surface of the silicon substrate. Typically implant angle α will be maintained at about 45°.

The implant ions may comprise a Group III element such as gallium or indium (boron is probably too light), a Group V element such as arsenic or antimony (phosphorus may be too light), or a Group IV element such as germanium. Since the purpose of the implant is to disrupt the crystal structure, and not to dope, inert Group VIII elements such as argon, krypton, or xenon could also be used. It should be noted, however, that the practice of the process of the invention is still valuable even when non-doping ions are used for the amorphization because such implanted ions are also capable of damaging the underlying gate oxide if channeling of the implanted ions through the polysilicon gate electrode is not stopped in some manner.

The dosage used for the implant should be equivalent to an arsenic dosage ranging from about $1 \times 10^{14}$ atoms/cm$^2$ to about $3 \times 10^{14}$ atoms/cm$^2$. Since what is desired is an amorphization of the single crystal silicon structure adjacent the surface of silicon substrate 2 at source region 6 and drain region 8, as well as amorphization of the surface of polysilicon gate electrode 20, the implant energy used will be low, ranging from about 20 KeV to about 40 KeV.

It will be noted from FIG. 1 that the implant is a blanket implant and no masks need be used. While the implant may be conducted in a single position, such as illustrated in FIG. 1, substrate 2 may also be rotated through 90° intervals during the implantation, while maintaining the tilt angle. It should be further noted that while the operation of the invention has been illustrated with the substrate tilted with respect to the horizontal, with a vertical implant beam shown, the implant beam could be tilted instead of the substrate, depending upon the type of implant apparatus used, as long as angle α between the line B, defining the axis of implanting beam 40, and line A, defining the axis perpendicular to the plane of the surface of substrate 2, is maintained within the defined range.

Figure 2:
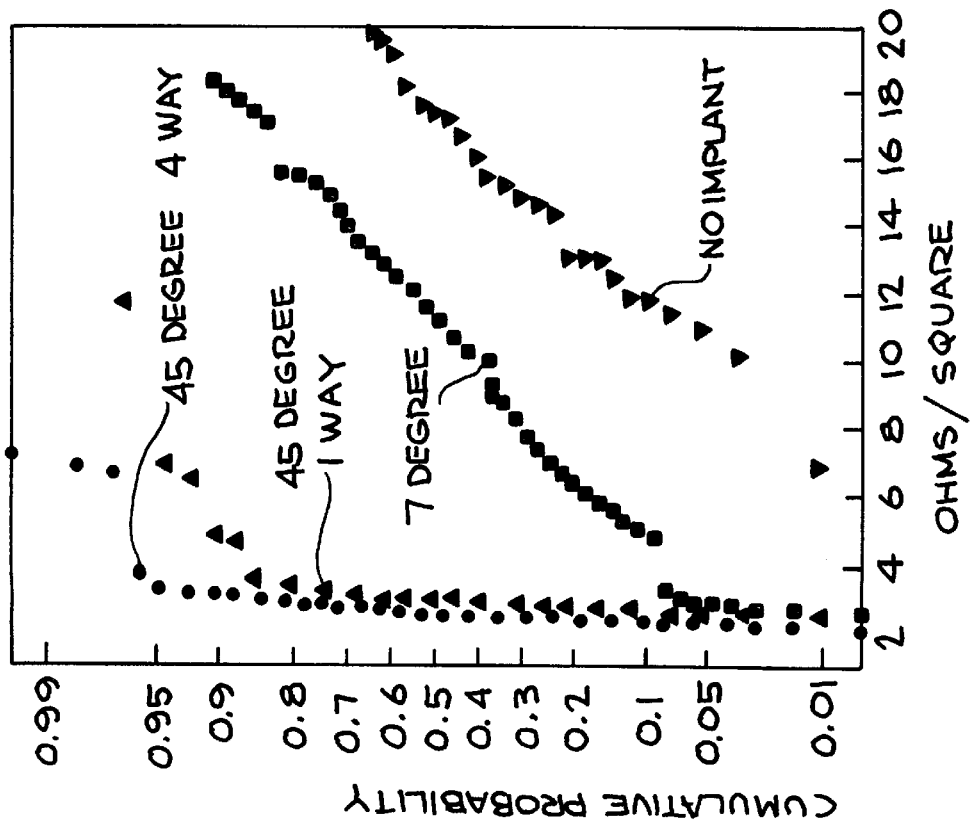
FIG. 2 is a graph showing the lower sheet resistance of the polysilicon gate electrode after an implant in accordance with the invention.

FIG. 2 shows a plot of the sheet resistances of several polysilicon gate electrodes after formation of a titanium silicide surface thereon. The sheet resistance values, plotted along the abscissa of the graph, are in ohms/square, while the probability is plotted along the ordinate axis. The □ symbol signifies the sheet resistance of a polysilicon gate electron implanted at the conventional implant angle of 7° and the ▽ symbol illustrates the sheet resistance with no implantation. The Δ symbol and the ○ symbol both show the sheet resistances for polysilicon gate electrodes implanted at an implant angle of 45° in accordance with the invention. The Δ symbol illustrates implantation at 45°, but with no rotation, while the ○ symbol illustrates implantation at 45° with four 90° rotations during the implantation. It will be note that the sheet resistances of the polysilicon gate electrodes implanted in accordance with the invention are markedly lower than either the unimplanted electrodes or the electrodes conventionally implanted at a 7° tilt angle.

Figure 3:
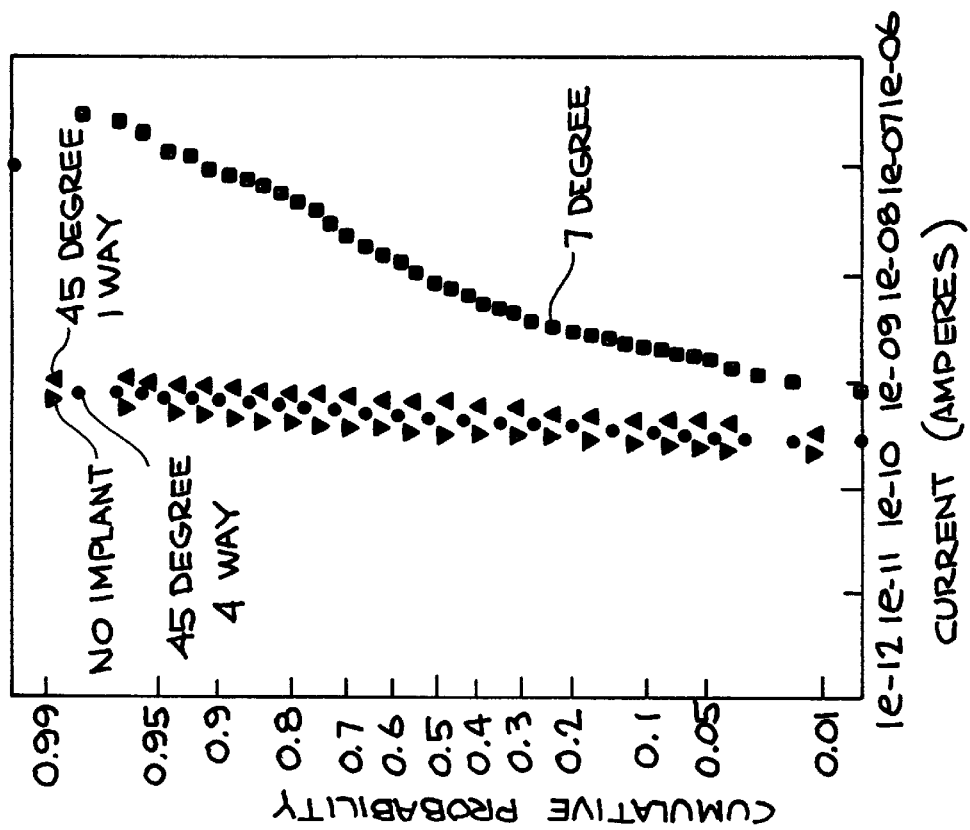
FIG. 3 is a graph showing the leakage current of NMOS devices respectively implanted at a 45° angle in accordance with the invention, conventionally implanted at a 7° angle, and with no implantation.

FIG. 3 illustrates the lower leakage current of an MOS device after implantation at a tilt angle of 45° in accordance with the invention versus a conventional implantation at a tilt angle of 7°. The leakage current of the MOS device (leakage current flowing from source to drain when device is in an off state) is plotted along the abscissa of the graph in amps. In this plot, the □ symbol again signifies a polysilicon gate electron implanted at the conventional implant angle of 7° and the ▽ symbol illustrates no implantation. The Δ symbol again illustrates implantation at 45°, but with no rotation, while the ○ symbol illustrates implantation at 45° with four 90° rotations during the implantation. It will be noted that the leakage currents of the MOS devices constructed on a substrate implanted in accordance with the invention are comparable to the leakage current of an MOS device constructed on an unimplanted substrate, while the leakage current for the MOS device constructed on a conventionally implanted substrate (a substrate implanted at 7°) shows considerably higher leakage current.

Thus the invention provides an improved process for the amorphization of exposed portions of a silicon substrate and a polysilicon gate electrode resulting in the subsequent formation of smaller grain size metal silicide which can be converted to C54 phase metal silicide without undue extension of the annealing time or temperature thus conserving the thermal budget. In accordance with the practice of the invention, by amorphizing the exposed surfaces of the silicon substrate and the polysilicon gate electrode using an implant tilt angle ranging from 15° to about 60°, and preferably from about 30° to about 60°, undesired implantation of the channel region of the substrate and/or damage to the gate oxide, can be avoided while still realizing the benefits of amorphizing the exposed surfaces of the silicon substrate and polysilicon gate electrode.

Having thus described the invention what is claimed is:

1. An improved process for implanting the exposed portions of a surface of a silicon substrate and the surface of a polysilicon gate electrode to amorphize such silicon to permit the subsequent formation of metal silicide having smaller grain size than metal silicide formed from non-amorphized silicon, the improvement comprising:
   a) orienting said silicon substrate to an implantation beam so that the axis of said implantation beam defines an angle ranging from about 15° to about 60° with a line perpendicular to the plane of said surface of said substrate; and
   b) implanting said exposed portions of said surface of said silicon substrate and said polysilicon gate electrode surface with said implantation beam to amorphize said silicon surfaces while maintaining said tilt angle between the axis of said implantation beam and said line perpendicular to said plane of said surface of said silicon substrate.

2. The process of claim 1 wherein said exposed silicon surfaces are implanted with an ion capable of amorphizing said exposed silicon surfaces selected from the group of elements consisting of a Group III element, a Group IV element, a Group V element, and a Group VIII element.

3. The process of claim 1 wherein said exposed silicon surfaces are implanted with an ion selected from the group of elements consisting of gallium, indium, germanium, arsenic, antimony, argon, krypton, and xenon.

4. The process of claim 1 wherein said ions are implanted at a dosage level equivalent to an arsenic dosage ranging from about $1 \times 10^{14}$ atoms/cm$^2$ to about $3 \times 10^{14}$ atoms/cm$^2$.

5. The process of claim 1 wherein said ions are implanted at an implant energy ranging from about 20 KeV to about 40 KeV.

6. The process of claim 1 wherein said tilt angle ranges from about 30° to about 60°.

7. The process of claim 1 wherein said tilt angle ranges from about 40° to about 50°.

8. The process of claim 1 wherein said tilt angle is about 45°.

9. The process of claim 1 wherein said implanting step further comprises rotating said silicon substrate through one or more 90° intervals while maintaining said angle between said axis of said implantation beam and said line perpendicular to said plane of said surface of said silicon substrate.

10. The process of claim 1 wherein said implanting step further comprises rotating said silicon substrate through four 90° intervals while maintaining said angle between said axis of said implantation beam and said line perpendicular to said plane of said surface of said silicon substrate.

11. An improved process for implanting exposed portions of the surface of a silicon substrate where source and drain regions of an MOS device have been formed and for implanting the surface of a polysilicon gate electrode of said MOS device to amorphize such exposed portions of said silicon substrate surface and said polysilicon gate electrode surface to permit the subsequent formation of metal silicide on said implanted surfaces having smaller grain size than metal silicide formed from non-amorphized silicon without increasing the leakage current of said MOS device, the improvement comprising:
   a) orienting said silicon substrate to an implantation beam so that the axis of said implantation beam defines an angle ranging from about 30° to about 60° with a line perpendicular to the plane of the surface of said substrate; and
   b) implanting said exposed portions of said surface of said silicon substrate and said polysilicon gate electrode surface with said implantation beam to amorphize said exposed silicon surfaces while maintaining said tilt angle between the axis of said implantation beam and said line perpendicular to said plane of said surface of said silicon substrate;
whereby implantation of said ions, from said implantation beam, into the gate oxide or the channel of said MOS device, is inhibited.

12. The process of claim 11 wherein said exposed silicon surfaces are implanted with an ion capable of amorphizing said exposed silicon surfaces selected from the group of elements consisting of a Group III element, a Group IV element, a Group V element, and a Group VIII element.

13. The process of claim 11 wherein said exposed silicon surfaces are implanted with an ion selected from the group of elements consisting of gallium, indium, germanium, arsenic, antimony, argon, krypton, and xenon.

14. The process of claim 11 wherein said ions are implanted at a dosage level equivalent to an arsenic dosage ranging from about $1 \times 10^{14}$ atoms/cm$^2$ to about $3 \times 10^{14}$ atoms/cm$^2$.

15. The process of claim 11 wherein said ions are implanted at an implant energy ranging from about 20 KeV to about 40 KeV.

16. The process of claim 11 wherein said tilt angle between the axis of said implantation beam and said line perpendicular to said plane of said surface of said silicon substrate ranges from about 30° to about 45°.

17. A silicon substrate having exposed portions of the surface thereof where source and drain regions of an MOS device have been formed and a polysilicon gate electrode with an upper surface thereon, said gate electrode formed on said substrate surface between said source and drain regions of said MOS device, said exposed surface of said silicon substrate and said exposed surface of said polysilicon gate electrode amorphized to permit the subsequent formation of metal silicide on said implanted surfaces having smaller grain size than metal silicide formed from non-amorphized silicon without increasing the leakage current of said MOS device, said amorphized surfaces formed by:
   a) orienting said silicon substrate to an implantation beam so that the axis of said implantation beam defines an angle ranging from about 15° to about 60° with a line perpendicular to the plane of the surface of said substrate; and
   b) implanting said exposed portions of said surface of said silicon substrate and said polysilicon gate electrode surface with said implantation beam to amorphize said exposed silicon surfaces while maintaining said tilt angle between the axis of said implantation beam and said line perpendicular to said plane of said surface of said silicon substrate;

whereby implantation of said ions, from said implantation beam, into the gate oxide or the channel of said MOS device, is inhibited.

18. The process of claim 11 wherein said implanting step further comprises rotating said silicon substrate through one or more 90° intervals while maintaining said angle between said axis of said implantation beam and said line perpendicular to said plane of said surface of said silicon substrate.

19. The process of claim 11 wherein said implanting step further comprises rotating said silicon substrate through four 90° intervals while maintaining said angle between said axis of said implantation beam and said line perpendicular to said plane of said surface of said silicon substrate.

20. The process of claim 11 wherein said tilt angle ranges from about 40° to about 50°.

21. An improved process for implanting the surface of a polysilicon gate electrode of an MOS device to amorphize said polysilicon gate electrode surface to permit the subsequent formation of metal silicide on said implanted surfaces having a smaller grain size than metal silicide formed from non-amorphized silicon without increasing the leakage current of said MOS device, the improvement comprising:

a) orienting a silicon substrate to an implantation beam so that the axis of said implantation beam defines an angle ranging from about 30° to about 60° with a line perpendicular to the plane of the surface of said substrate;

b) implanting said surface of said polysilicon gate electrode with a non-dopant ion, capable of amorphizing said polysilicon gate electrode, said non-dopant ion selected from the group of consisting of germanium, argon, krypton, and xenon; and c) maintaining said tilt angle between the axis of said implantation beam and said line perpendicular to said plane of said surface of said silicon substrate during said implantation;

whereby implantation of said ions, from said implantation beam, into the gate oxide or the channel of said MOS device beneath said polysilicon gate electrode, is inhibited.

* * * * *